(12) United States Patent
Quelen

(10) Patent No.: US 10,418,977 B2
(45) Date of Patent: Sep. 17, 2019

(54) CONTROL CIRCUIT FOR TRANSISTOR BIASING

(71) Applicant: Commissariat à l'Énergie Atomique et aux Énergies Alternatives, Paris (FR)

(72) Inventor: Anthony Quelen, Seyssins (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/224,653

(22) Filed: Dec. 18, 2018

(65) Prior Publication Data

US 2019/0190500 A1  Jun. 20, 2019

(30) Foreign Application Priority Data

Dec. 19, 2017  (FR) ...................... 17 62532

(51) Int. Cl.
   *G05F 3/20* (2006.01)
   *H03K 3/012* (2006.01)
   *H01L 27/02* (2006.01)
   *H02M 3/07* (2006.01)

(52) U.S. Cl.
   CPC ......... *H03K 3/012* (2013.01); *H01L 27/0222* (2013.01); *H02M 3/07* (2013.01)

(58) Field of Classification Search
   CPC .......... G05F 3/205; H02M 3/07; H03K 3/012; H01L 27/0222
   USPC .......................................... 327/530, 534–537
   See application file for complete search history.

(56) References Cited

U.S. PATENT DOCUMENTS

| 7,250,807 | B1 | 7/2007 | Doyle |
| 8,816,754 | B1 | 8/2014 | Clark et al. |
| 2003/0080802 | A1 | 5/2003 | Ono et al. |
| 2006/0132218 | A1 | 6/2006 | Tschanz et al. |
| 2007/0236277 | A1* | 10/2007 | Naritake ................. G05F 3/205 327/534 |

OTHER PUBLICATIONS

FR1762532, Aug. 13, 2018, Preliminary Search Report.
Preliminary Search Report for French Application No. 1762532, dated Aug. 13, 2018.
Blagojevic et al., A Fast, Flexible, Positive and Negative Adaptive Body-Bias Generator in 28nm FDSOI. IEEE 2016 Symposium on VLSI Circuits Digest of Technical Papers. 2016:1-2.

(Continued)

*Primary Examiner* — Tomi Skibinski
(74) *Attorney, Agent, or Firm* — Wolf, Greenfield & Sacks, P.C.

(57) ABSTRACT

A transistor biasing circuit including a first controller configured to receive a sensor signal generated based on the performance of one or more transistors of a digital circuit and to compare the sensor signal with a reference signal and to generate a first biasing voltage control signal; a first actuator configured to generate a first biasing voltage based on the first biasing voltage control signal; a second actuator configured to generate a second biasing voltage based on a second biasing voltage control signal; and a second controller configured to generate the second biasing voltage control signal based on an intermediate voltage level generated based on the first and second biasing voltages.

12 Claims, 10 Drawing Sheets

(56) References Cited

OTHER PUBLICATIONS

Mauricio et al., Local Variations Compensation with DLL-based Body Bias Generator for UTBB FD-SOI technology. 2015 IEEE 13th International New Circuits and Systems Conference (NEWCAS). 2015:1-4.

* cited by examiner

CONTROL CIRCUIT FOR TRANSISTOR BIASING

FIELD

The present disclosure relates to the field of integrated circuits, and in particular to a circuit and method for applying body biasing voltages to n-type and/or p-type wells of an integrated circuit.

BACKGROUND

It has been proposed to alter the body biasing voltages of transistors of an integrated circuits in order to increase performance and/or reduce power consumption.

A shift towards SOI (silicon on insulator) based transistor technology makes body biasing a particularly interesting proposition as this technology permits a relatively broad range of biasing voltages, for example from as low as −3 V to as high as +3 V, to be applied to the body of the devices. This compares to a more limited body biasing range of −300 mV to +300 mV in the case of bulk transistors. The biasing voltage is applied to the p-type or n-type well underlying each SOI transistor device, sometimes referred to as the back gate.

For example, forward body biasing (FBB) involves applying a body biasing voltage to decrease the transistor threshold voltage and thus increase performance by increasing the speed of the transistors. Reverse body biasing (RBB) involves applying a body biasing voltage that increases the transistor threshold voltage and thus reduces current leakage and power consumption.

Existing techniques for generating forward and reverse body biasing voltages have drawbacks in terms of complexity and/or lead to relatively poor power consumption for a given performance level.

SUMMARY

It is an aim of embodiments of the present description to at least partially address one or more problems in the prior art.

According to one aspect, there is provided a transistor biasing circuit comprising: a first controller configured to receive a sensor signal generated based on the performance of one or more transistors of a digital circuit, the first controller being configured to compare the sensor signal with a reference signal and to generate a first biasing voltage control signal based on said comparison; a first actuator configured to generate a first biasing voltage for biasing wells of transistors of a first type in said digital circuit based on said first biasing voltage control signal; a second actuator configured to generate a second biasing voltage for biasing wells of transistors of a second type in said digital circuit based on a second biasing voltage control signal; and a second controller configured to generate the second biasing voltage control signal based on an intermediate voltage level generated based on the first and second biasing voltages. For example, the first controller and first actuator form a first control loop that controls the first biasing voltage and not the second biasing voltage, and the second controller and second actuator form a second control loop that controls the second biasing voltage and not the first biasing voltage.

According to an embodiment, the sensor signal is a frequency signal generated by a plurality of transistors of the digital core biased by said first and second biasing voltages, the frequency of the frequency signal being dependent on the speed of said transistors.

According to an embodiment, the transistor biasing circuit further comprises a further sensor configured to generate said intermediate voltage level.

According to an embodiment, the further sensor comprises a resistive divider or an ON resistance sensor.

According to an embodiment, the sensor signal represents a current leakage of a plurality of transistors of the digital core biased by said first and second biasing voltages, and the further sensor comprises a current leakage sensor.

According to an embodiment, the second controller further comprises a first comparator configured to compare said intermediate voltage level with a first voltage threshold and a second comparator configured to compare said intermediate voltage level with a second voltage threshold.

According to an embodiment, the first and second voltage thresholds are fixed thresholds.

According to an embodiment, the first and second voltage thresholds are variable thresholds based on a variable reference signal generated by said further sensor.

According to an embodiment, the first and second actuators are charge pumps.

According to embodiment further aspect, there is provided an integrated circuit comprising a digital circuit and the above transistor biasing circuit, wherein the one or more transistors of said digital circuit are SOI (silicon on insulator) transistors.

According to a further aspect, there is provided a method of generating transistor biasing voltages comprising: receiving, by a first controller, a sensor signal generated based on the performance of one or more transistors of a digital circuit; comparing, by the first controller, the sensor signal with a reference signal and generating a first biasing voltage control signal based on said comparison; generating, by a first actuator based on said first biasing voltage control signal, a first biasing voltage for biasing wells of transistors of a first type in said digital circuit; generating, by a second actuator based on a second biasing voltage control signal, a second biasing voltage for biasing wells of transistors of a second type in said digital circuit; and generating, by a second controller, the second biasing voltage control signal based on an intermediate voltage level generated based on the first and second biasing voltages. For example, the first controller and first actuator form a first control loop that controls the first biasing voltage and not the second biasing voltage, and the second controller and second actuator form a second control loop that controls the second biasing voltage and not the first biasing voltage.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present disclosure, the term "connected" is used to designate a direct electrical connection between circuit elements, whereas the term "coupled" is used to designate an electronical connection between circuit elements that may be direct, or may be via one or more intermediate elements such as resistors, capacitors or transistors. The term "approximately" is used to designate a tolerance of plus or minus 10 percent of the value in question.

Furthermore, the following terms are given the following definitions:

transistor biasing voltage—a voltage applied as a body biasing voltage to a CMOS bulk transistor or to an SOI (silicon on insulator) transistor (also known as a fully depleted SOI (FDSOI) transistor) thereby causing a modification to the gate threshold voltage VT of the transistor;

forward body biasing (FBB)—the application of transistor body biasing voltages to PMOS and/or NMOS transistors in order to lower their threshold voltage VT and increase performance by increasing their speed; and reverse body biasing (RBB)—the application of transistor body biasing voltages to PMOS and/or NMOS transistors in order to increase their threshold voltage VT and reduce power consumption by reducing current leakage.

Figure 1A:
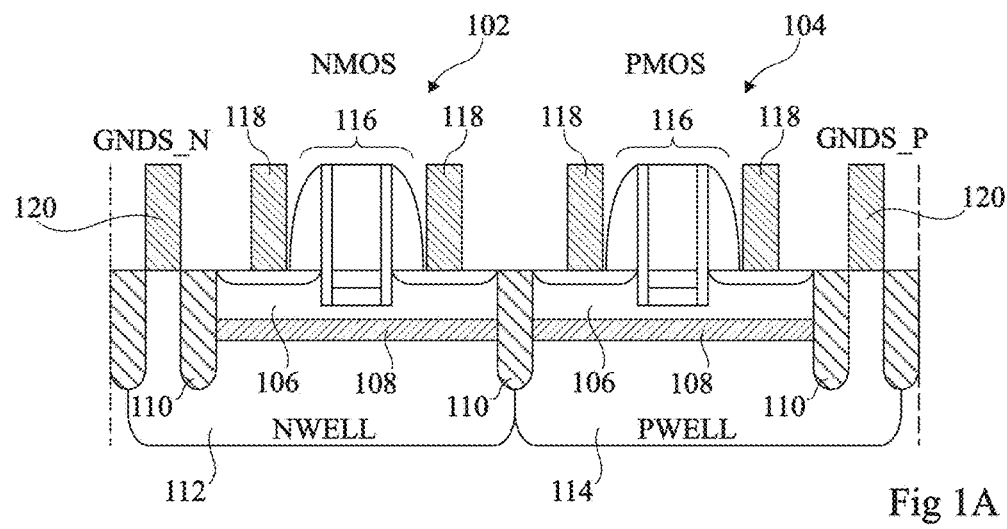
FIG. 1A is a cross-section view of a pair of CMOS LVT (low-VT) silicon-on-insulator transistors according to an example embodiment.

FIG. 1A is a cross-section view of a pair of SOI (silicon-on-insulator) CMOS transistors 102, 104 according to an example embodiment in which the transistors are low threshold voltage (LVT) transistors, having flipped wells with respect to standard bulk CMOS transistors. The transistor 102 is an n-channel MOS (NMOS) transistor and the transistor 104 is a p-channel MOS (PMOS) transistor. Each of the transistors 102, 104 is formed in a silicon layer 106, which is formed on a layer 108 of insulator. The silicon and insulator layers 106, 108 of each transistor are laterally delimited by isolation trenches 110, which are for example STIs (shallow trench isolations). The NMOS transistor 102 is formed over an n-type well (NWELL) 112, and the PMOS transistor 104 is formed over a p-type well (PWELL) 114.

Each of the transistors 102, 104 further comprises a gate stack 116 formed partially over and partially within the respective silicon layer 106, and source/drain contacts 118. Each transistor 102, 104 further comprises a body contact 120 allowing a body biasing voltage GNDS_N to be applied to the NWELL 112 and a body biasing voltage GNDS_P to be applied to the PWELL 114.

Figure 1B:
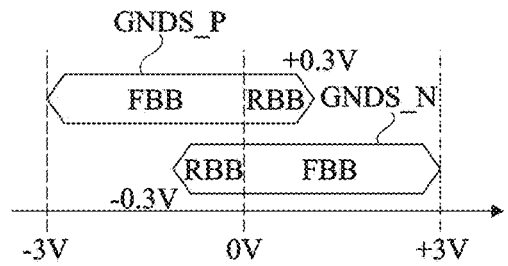
FIG. 1B is a graph representing body biasing voltage ranges for the transistors of FIG. 1A according to an example embodiment.

FIG. 1B is a graph representing example ranges of the body biasing voltages GNDS_P and GNDS_N applied to the transistors of FIG. 1A according to an example embodiment. Both of the body biasing voltages GNDS_P and GNDS_N is for example at 0 V in the case that no body biasing voltage is applied. The body biasing voltage GNDS_P is for example a negative voltage of between 0 V and −3 V in the case of a forward body biasing voltage FBB, and a positive voltage of between 0 V and 0.3 V in the case of a reverse body biasing voltage RBB. The body biasing voltage GNDS_N is for example a negative voltage of between 0 V and −0.3 V in the case of a reverse body biasing voltage RBB, and a positive voltage of between 0 V and +3 V in the case of a forward body biasing voltage FBB.

Figure 2A:
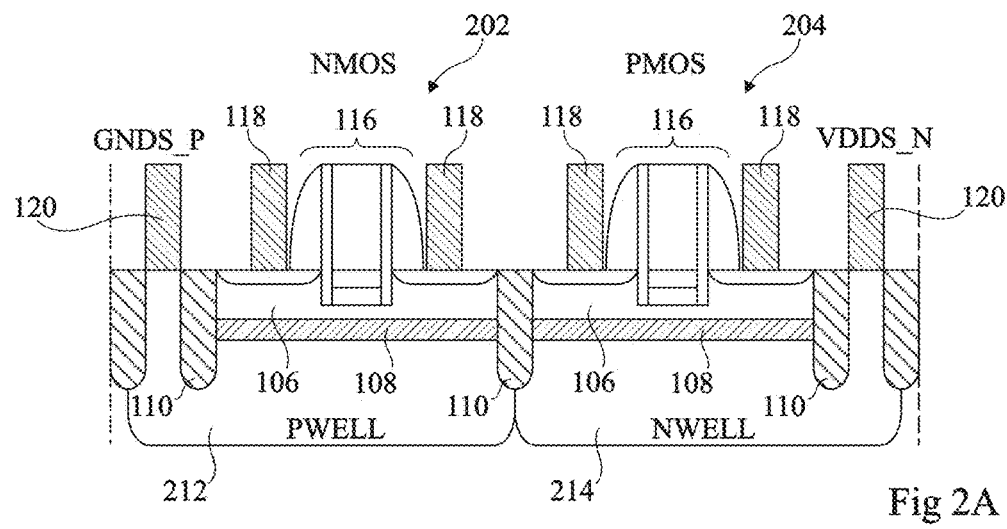
FIG. 2A is a cross-section view of a pair of CMOS RVT (regular-VT) silicon-on-insulator transistors according to an example embodiment.

FIG. 2A is a cross-section view of a pair of SOI (silicon-on-insulator) CMOS transistors 202, 204 according to an example embodiment in which the transistors are regular threshold voltage (RVT) transistors. The structures of these transistors are very similar to those of the LVT transistors 102, 104 of FIG. 1A, and like features are labelled with like references in FIG. 2A and will not be described again in detail. However, the NMOS transistor 202 is formed over a PWELL 212, and the PMOS transistor 204 is formed over an NWELL 214. Furthermore, a body biasing voltage GNDS_P is applied to the PWELL 212 and a body biasing voltage VDDS_N is applied to the NWELL 214.

Figure 2B:
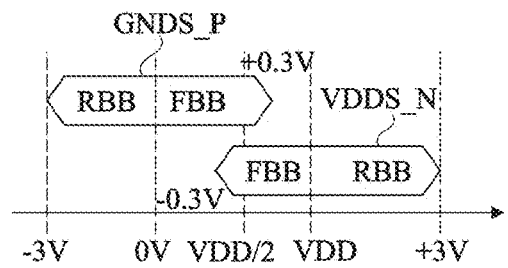
FIG. 2B is a graph representing body biasing voltage ranges for the transistors of FIG. 2A according to an example embodiment.

FIG. 2B is a graph representing the ranges of the body biasing voltages GNDS_P and VDDS_N applied to the transistors of FIG. 2A according to an example embodiment. In the case that no body biasing voltage is applied, the body biasing voltage GNDS_P is for example at 0 V and the body biasing voltage VDDS_N is at the supply voltage VDD. The body biasing voltage GNDS_P is for example a negative voltage of between 0 V and −3 V in the case of a reverse body biasing voltage RBB, and a positive voltage of between 0 V and 0.3 V in the case of a forward body biasing voltage FBB. The body biasing voltage VDDS_N is for example at less than VDD and down to −0.3 V in the case of a forward body biasing voltage FBB, and greater than VDD and up to +3 V in the case of a reverse body biasing voltage RBB. The supply voltage VDD is for example at approximately 0.6 V.

In the following description, embodiments are described in which an NWELL voltage VNW and a PWELL voltage VPW are generated by a transistor biasing circuit. Such voltages are for example suitable for driving the NWELL 112 and PWELL 114 of FIG. 1A, or the NWELL 212 and PWELL 214 of FIG. 2A. However, the principles described herein could be applied more generally to the biasing of wells of two different types of transistors, where the wells may or may not be of the same type.

For example, the circuit to be biased could comprise PMOS LVT transistors and NMOS RVT transistors each having a PWELL formed over a deep NWELL. The transistor types are thus defined only by the types of gate and doping. Furthermore, the PWELLs are isolated from each other by SiO2 trenches such that different PWELL voltages VPW can be applied to each transistor type. This for example allows each of the transistor types to be biased by a voltage in a same range, but which will have a different effect on each of the transistor types.

In alternative embodiments, the principles described herein could be applied to two types of n-channel transistor or two types of p-channel transistor, wherein the voltage range of the biasing voltage of each transistor type is different.

Figure 3:
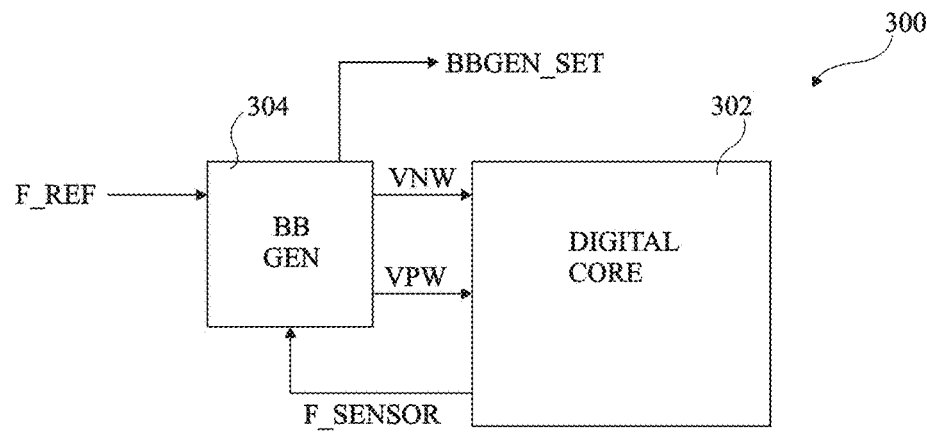
FIG. 3 schematically illustrates an integrated circuit including a body biasing voltage generator according to an example embodiment.

FIG. 3 schematically illustrates an integrated circuit 300 comprising a digital core (DIGITAL CORE) 302 and a body biasing voltage generator (BB GEN) 304 according to an example embodiment. The digital core 302 for example comprises SOI MOS transistors (not illustrated in FIG. 3), which are for example similar to the transistors 102 and 104 of FIG. 1A and/or the transistors 202 and 204 of FIG. 2A. Additionally or alternatively, the digital core 302 may comprise other types of transistors, such as bulk MOS transistors. The generator 304 for example receives a signal F_REF indicating a target transistor performance, and a sensor signal F_SENSOR from the digital core 302 representing a detected transistor performance. The generator 304 for example generates the body biasing voltages VNW and VPW for driving the NWELLs and PWELLs respectively of one or more of the transistors of the digital core 302 based on a comparison between the sensed transistor performance and the target transistor performance. The generator 304 also for example generates a signal BBGEN_SET described in more detail below.

For example, in one embodiment, the sensor signal is a frequency signal generated by a ring oscillator or the like implemented in the digital core 302 using NMOS and PMOS transistors. In this way, these transistors, which are biased by the generated biasing voltages VNW and VPW, have PVT (process, voltage, temperature) conditions similar to those of the other transistors of the digital core 302, and the frequency that is generated will thus be representative of the performance of the transistors in the digital core. The target signal F_REF in such a case is for example a frequency signal generated as a function of a target operating speed of the digital core.

However, it will be apparent to those skilled in the art that rather than being frequency signals, the sensor signal F_SENSOR and target signal F_REF could be other types of signals that respectively represent a measured transistor performance and a target transistor performance.

Furthermore, while in the following description examples are described in which the sensed and target transistor performance correspond to the transistor speed, in alternative embodiments, the performance could be a parameter other than transistor speed. For example, it would be possible to use sensors that sense transistor current leakage.

Figure 4:
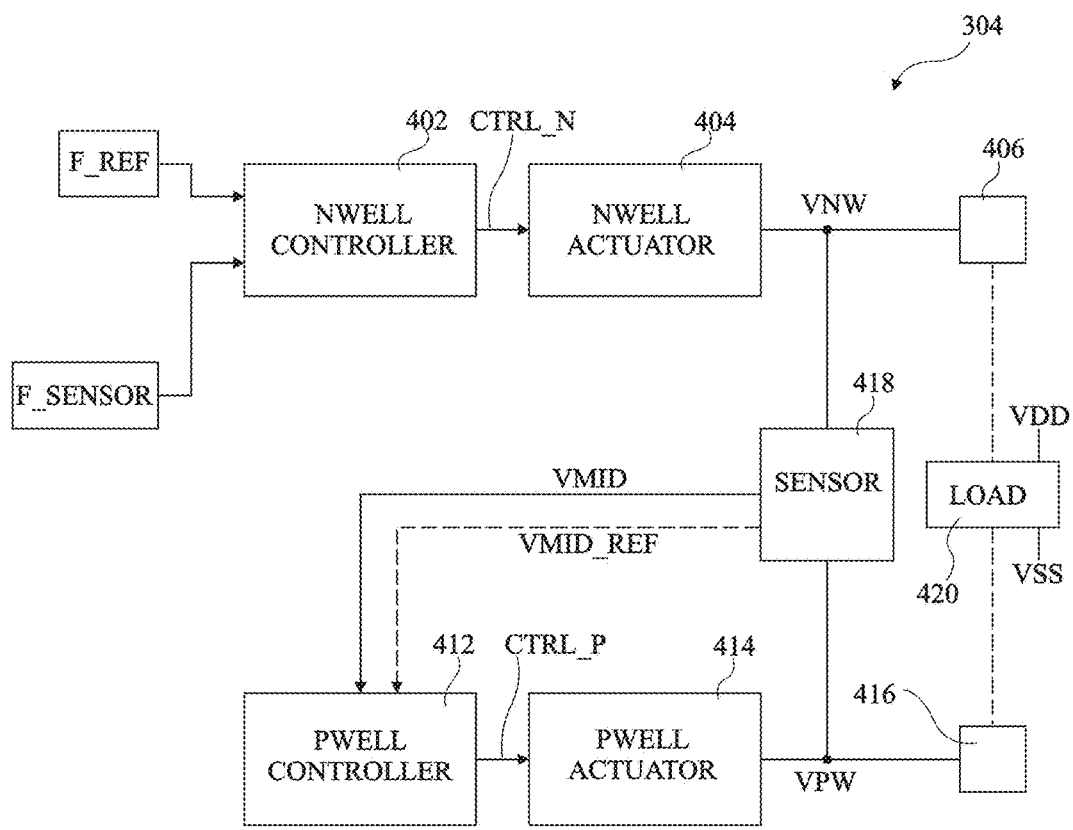
FIG. 4 schematically illustrates the body biasing voltage generator of FIG. 3 in more detail according to an example embodiment.

FIG. 4 schematically illustrates the body biasing voltage generator 304 of FIG. 3 in more detail according to an example embodiment.

The generator 304 for example comprises an NWELL controller (NWELL CONTROLLER) 402 receiving the signals F_REF and F_SENSOR, and generates, based on a comparison of these signals, a control signal CTRL_N, which is supplied to an NWELL actuator (NWELL ACTUATOR) 404. The NWELL actuator 404 generates the NWELL body biasing voltage VNW based on the control signal CTRL_N. For example, this voltage VNW corresponds to the voltage GNDS_N and/or VDDS_N of FIGS. 1B and 2B.

This voltage VNW is applied to an output node 406 coupled to some or all of the transistor NWELLs in the digital core 302.

The generator 304 further comprises a PWELL controller (PWELL CONTROLLER) 412, which receives an intermediate voltage VMID, and generates a control signal CTRL_P, which is supplied to a PWELL actuator (PWELL ACTUATOR) 414. The PWELL actuator 414 generates a PWELL body biasing voltage VPW based on the control signal CTRL_P. For example, this voltage VPW corresponds to the voltage GNDS_P of FIGS. 1B and 2B. This voltage VPW is applied to an output node 416 coupled to some or all of the transistor PWELLS in the digital core 302.

A sensor (SENSOR) 418 is for example coupled to the outputs of the NWELL and PWELL actuators 404, 414 such that it receives the voltages VNW and VPW, and generates the intermediate voltage VMID based on these voltages.

In some embodiments, the voltages VNW and VPW are generated to vary symmetrically around an intermediate level. In such a case, the sensor 418 is for example implemented by a resistive divider that generates a voltage halfway between the voltages VNW and VPW, and the PWELL controller 412 adjusts the voltage VPW until VMID is equal to the desired mid-point. For example, the desired mid-point may be at 0 V in the case of LVT transistors, or at VDD/2 in the case of RVT transistors.

Alternatively, the voltages VNW and VPW are generated to vary asymmetrically, for example such that the NMOS and PMOS transistors in the circuit provide similar performance to each other. Indeed, the process, the temperature and the aging conditions may cause a performance bias between two different types of transistors in the circuit, such as between the PMOS or NMOS transistors in the circuit, which could lead for example to a mismatch between the rise and fall times of the signals in the circuit or between the leakages of the two types of transistors. The body biasing voltages may be generated in order to at least partially correct this performance bias. In such a case, the sensor 418 for example generates, in addition to the voltage VMID, a variable reference voltage VMID_REF, as represented by a dashed arrow in FIG. 4.

A load (LOAD) 420 is represented in FIG. 4 coupled between the output nodes 406 and 416, and represents the capacitive load formed by the NWELLs and PWELLs of the digital core 302.

Thus, in the example of FIG. 4, the voltage VNW is generated and modified based on a sensed signal F_SENSOR, whereas the voltage VPW is generated and modified based on the voltage VMID. Of course, in alternative embodiments, the opposite could be implemented, the voltage VPW being generated by the controller 402 and actuator 404 based on the sensor signal F_SENSOR, and the voltage VNW being generated by the controller 412 and actuator 414 based on the voltage VMID.

Figure 5:
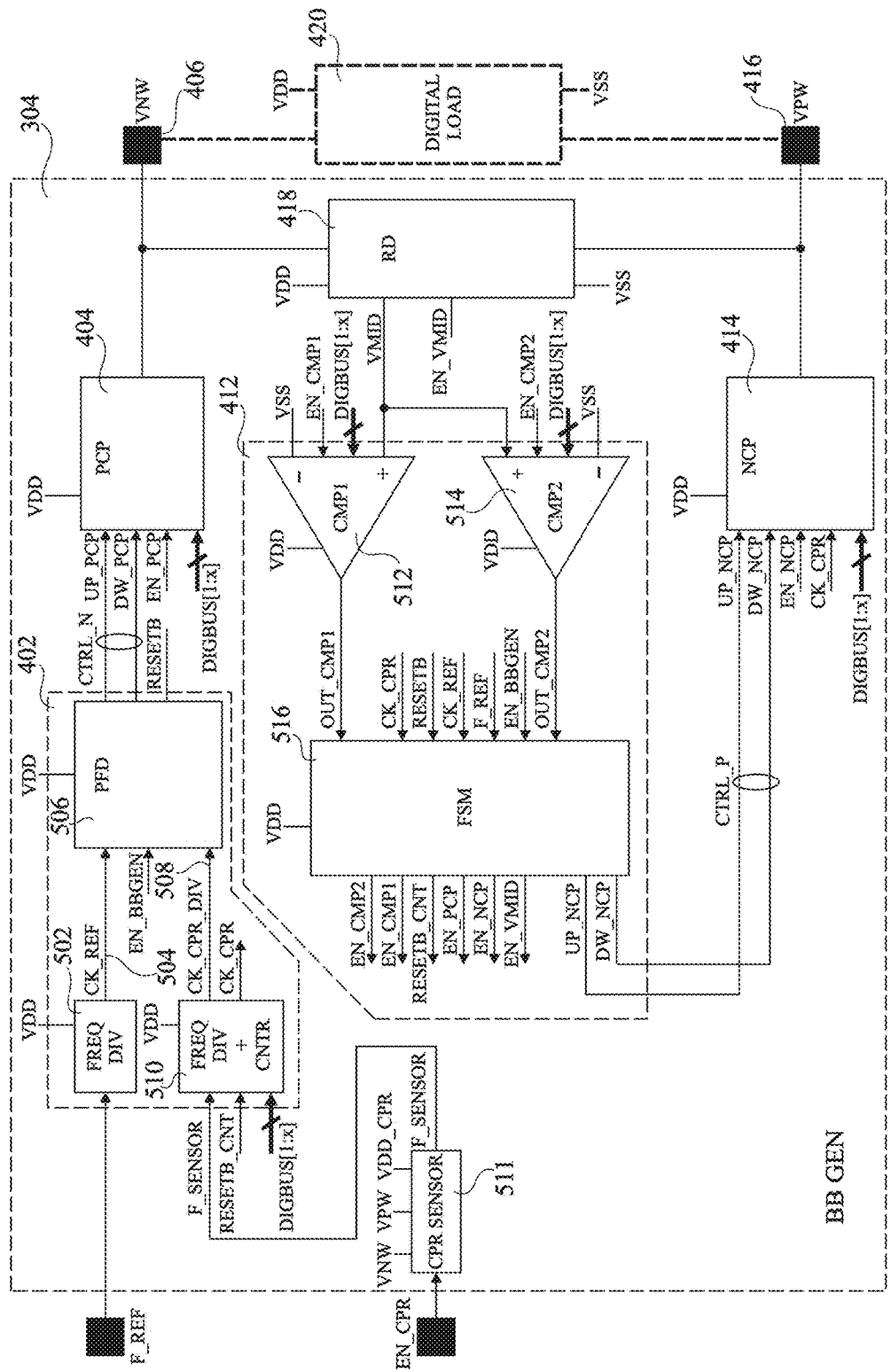
FIG. 5 schematically illustrates the body biasing voltage generator of FIG. 4 in more detail according to an example embodiment in which n-wells and p-wells are biased in a symmetrical fashion.

FIG. 5 schematically illustrates the body biasing voltage generator 304 of FIG. 4 in more detail according to an example embodiment in which the body biasing voltages VNW and VPW are generated in a symmetrical fashion.

In the example of FIG. 5, the reference signal F_REF and the sensor signal F_SENSOR are frequency signals.

As illustrated in FIG. 5, the NWELL controller 402 for example comprises a frequency divider (FREQ DIV) 502, which receives the reference signal F_REF, and generates an output frequency signal CK_REF on an output line 504. The output line 504 is coupled to a phase frequency detector (PFD) 506, which also for example receives a timing signal CK_CPR_DIV on a line 508 from a frequency divider and counter (FREQ DIV+CNTR) 510. The frequency divider and counter 510 receives the sensor signal F_SENSOR from a sensor (CPR SENSOR) 511, counts edges of this signal, and asserts the timing signal CK_CPR_DIV each time a certain count value is reached.

Based on the relative timing of the edges of the timing signals CK_REF and CK_CPR_DIV, the PFD 506 asserts the control signal CTRL_N to cause the NWELL actuator 404 to either increase, decrease, or maintain the level of the voltage VNW. In the example of FIG. 5, the NWELL actuator 404 is a positive charge pump (PCP), and the control signal CTRL_N comprises a signal UP_PCP, which is asserted by the PFD 506 to increase the voltage VNW, and a signal DW_PCP, which is asserted by the PFD 506 to decrease the voltage VNW.

In the example of FIG. 5, the sensor 418 is a resistive divider (RD), which generates the voltage VMID as the mid-point between the voltages VNW and VPW.

The PWELL controller 412 for example comprises comparators (CMP1) 512 and (CMP2) 514, each of which compares the voltage VMID with a reference voltage, which is for example 0 V plus an offset in the case of comparator 512, and 0 V minus an offset in the case of comparator 514, and generates output signals OUT_CMP1 and OUT_CMP2 respectively. The PWELL controller 412 also for example comprises a finite state machine (FSM) 516 receiving the output signals OUT_CMP1 and OUT_CMP2 of the comparators, and generating the control signal CTRL_P for controlling the PWELL actuator 414. In the example of FIG. 5, the PWELL actuator 414 is a negative charge pump (NCP), and the control signal CTRL_P comprises a signal UP_NCP, which is asserted by the FSM 516 to increase the voltage VPW, and a signal DW_NCP, which is asserted by the FSM 516 to decrease the voltage VPW.

The FSM 516 for example receives the timing signal CK_CPR from the frequency divider 510, a reset signal RESETB, the signals CK_REF and F_REF, and an enable signal EN_BBGEN of the body biasing voltage generator 304. The FSM 516 for example generates enable signals EN_CMP2, EN_CMP1, EN_PCP, EN_NCP and EN_VMID, for respectively enabling the comparators 514 and 512, the positive and negative charge pumps 404 and 414, and the resistive divider 418. The FSM 516 also generates a reset signal RESETB_CNT for resetting the counter of the circuit 510.

The frequency divider 510, positive charge pump 404, negative charge pump 414, and comparators 512 and 514 each for example receive a digital bus DIGIBUS[1:x] generated externally, which for example sets the gains of the positive and negative charge pumps 404, 414, the N number of the counter 510 and the comparator thresholds depending on the digital load area and the particular VDD level.

Figure 6:
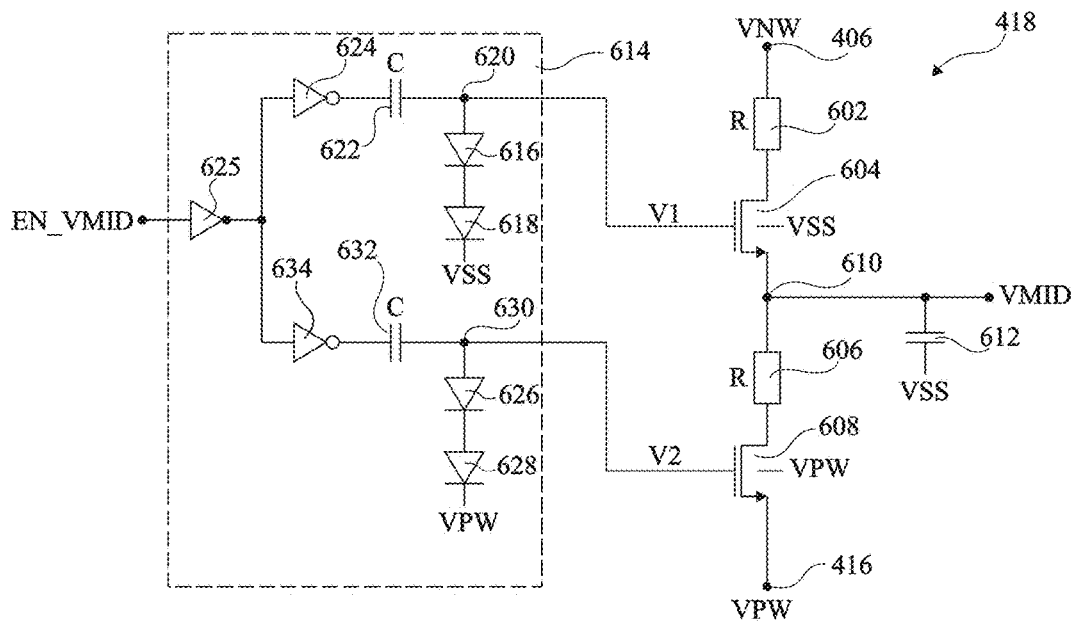
FIG. 6 schematically illustrates a resistive divider of FIG. 5 in more detail according to an example embodiment.

FIG. 6 schematically illustrates the resistive divider 418 of FIG. 5 in more detail according to an example embodiment. The divider 418 for example comprises the series connection of a resistor 602, an NMOS transistor 604, a resistor 606 and an NMOS transistor 608, between the nodes 406 and 416. An intermediate node 610 between the transistor 604 and the resistor 606 provides the output voltage VMID, and is for example coupled to one node of a capacitor 612, the other node of which is coupled to a voltage rail VSS, which is for example a negative voltage level. The resistors 602 and 606 for example have an equal resistance R, equal for example to between 50 kohms and 1 Mohm.

The transistors 604 and 608 for example have their bodies coupled to the supply rail VSS and to the voltage VPW respectively, and are respectively biased by voltages V1 and V2 generated by a control circuit 614. In particular, the voltages V1 and V2 are for example generated such that the gate source voltage VGS of the transistors 604 and 608 are approximately equal to each other. In the example of FIG. 6, the voltage V1 is generated by the voltage across a pair of series-connected diodes 616, 618, the anode of the diode 616 being coupled to a node 620, which is in turn coupled to the gate of transistor 604, and the cathode of the diode 618 being coupled to the voltage rail VSS.

The node 620 is further coupled to the VMID enable signal EN_VMID via the series connection of a capacitor 622, an inverter 624 and an inverter 625. Similarly, the voltage V2 is generated by the voltage across a pair of series-connected diodes 626, 628, the anode of the diode 626 being coupled to a node 630, which is in turn coupled to the gate of transistor 608, and the cathode of the diode 628 being coupled to node 416 in order to receive the PWELL voltage VPW. The node 630 is further coupled to the VMID enable signal EN_VMID via the series connection of a capacitor 632, an inverter 634 and the inverter 625.

Operation of the circuits of FIGS. 5 and 6 will now be described in more detail with reference to FIG. 7.

Figure 7:
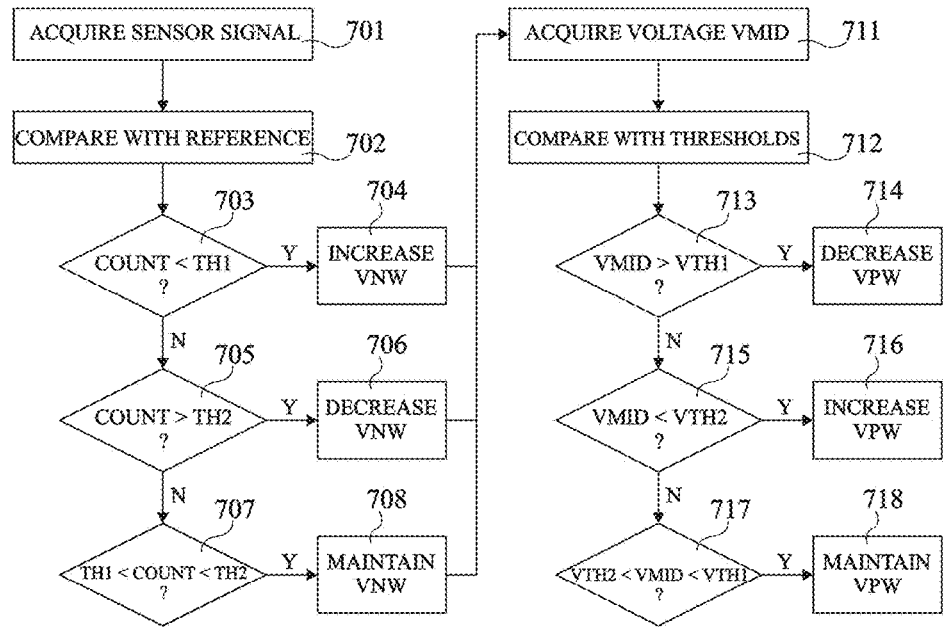
FIG. 7 is a flow diagram illustrating operations in a method of generating n-well and p-well body biasing voltages according to an example embodiment of the present disclosure.

FIG. 7 is a flow diagram illustrating operations in a method of regulating an NWELL voltage level VNW and a PWELL voltage level VPW.

In an operation 701, a sensor signal is acquired. For example, in the circuit of FIG. 5, this involves generating, by the CPR sensor 511, the frequency signal F_SENSOR.

In an operation 702, the acquired sensor signal is then compared with a reference signal. For example, in the circuit of FIG. 5, the NWELL controller 402 permits the frequency of the sensor signal F_SENSOR to be compared with that of the reference signal F_REF. This involves generating the signal CK_CPR by dividing the frequency of the sensor signal F_SENSOR, for example by 16, and then counting the rising edges of the signal CK_CPR until a certain count value is reached, equal to 65 in one example. The signal CK_CPR_DIV indicates when this count value is reached, and the PFD 506 compares the phase of this signal with a falling edge of the reference signal CK_REF.

In an operation 703, it is determined whether the sensor signal is below a threshold TH1. For example, if the signal CK_CPR_DIV is asserted after the falling edge of the signal CK_REF, this indicates that the count value was under 65 at the time of the CK_REF falling edge. If the sense signal is below the threshold TH1, in an operation 704, the NWELL voltage VNW is for example increased. Otherwise, the next operation is 705.

In operation 705, it is determined whether the sensor signal is above a threshold TH2. For example, if the signal CK_CPR_DIV is asserted more than 1.5 clock periods of the signal CK_CPR after the falling edge of the signal CK_REF, this indicates that the count value was over 66.5 at the time of the falling edge. If the sense signal is above the threshold TH2, in an operation 706, the NWELL voltage VNW is for example decreased. Otherwise, the next operation is 707.

In operation 707 it is determined whether the sensor signal is between the first and second thresholds TH1, TH2, for example between 65 and 66.5. For example, this will be the case if the signal CK_CPR_DIV is asserted less than 1.5 clock periods of the signal CK_CPR after the falling edge of the signal CK_REF. If so, the next operation is 708, in which the NWELL voltage VNW is maintained at its current level, by for example asserting neither the signal UP_PCP nor the signal DW_PCP.

After the operation 704, 706 or 708, an operation 711 is performed, in which the intermediate voltage VMID of the NWELL and PWELL voltages VNW, VPW is acquired. For example, in the circuit of FIG. 6, a resistive divider is used to generate the voltage VMID.

In an operation 712, the acquired voltage VMID is then compared with threshold voltages. For example, the voltages VNW and VPW are rendered symmetrical around a target intermediate voltage equal for example to 0 V, with a tolerance of for example +/−20 mV. The comparator 512 thus for example compares the voltage VMID with a threshold voltage VTH1 equal to VTAR+20 mV, and the comparator 514 for example compares the voltage VMID with a threshold voltage VTH2 equal to VTAR−20 mV, where VTAR is the target intermediate voltage.

In an operation 713, it is determined whether the voltage VMID is above the threshold VTH1, which is for example equal to +20 mV. If so, in an operation 714, the PWELL voltage VPW is for example decreased by asserting the signal DW_NCP until VMID is equal to less than +10 mV or until a next rising edge of the signal F_REF. Otherwise, the next operation is 715.

In operation 715, it is determined whether the voltage VMID is below the threshold VTH2, which is for example equal to −20 mV. If so, in an operation 716, the PWELL voltage VPW is for example increased by asserting the signal UP_NCP until VMID is equal to more than −10 mV or until a next rising edge of the signal F_REF. Otherwise, the next operation is 717.

In operation 717, it is determined whether the voltage VMID is between the threshold levels VTH1 and VTH2, and if so, the voltage VPW is maintained in an operation 718, for example by asserting neither the signal UP_NCP nor the signal DW_NCP.

After operations 714, 716 and 718, the method for example returns to operation 701 on a subsequent cycle of the NWELL controller.

FIGS. 8A to 8H are timing diagrams representing examples of signals in the circuits of FIGS. 5 and 6.

Figure 8A:
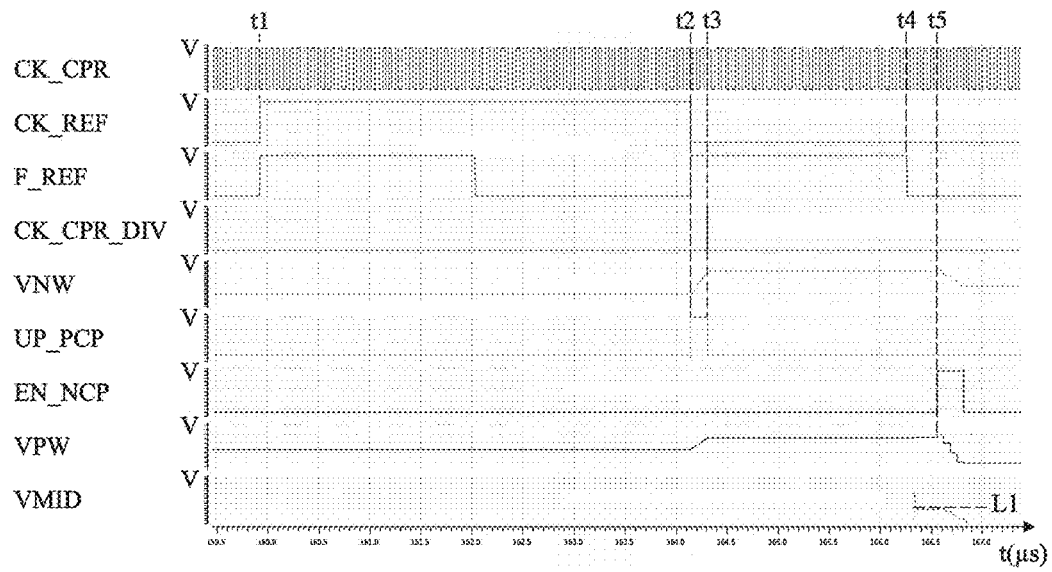
FIGS. 8A to 8H are timing diagrams representing the operation of the circuits of FIGS. 5 and 6 according to an example embodiment.

FIG. 8A illustrates examples of the signals CK_CPR, CK_REF, F_REF, CK_CPR_DIV, VNW, UP_PCP, EN_NCP, VPW and VMID.

At a time t1, the signal F_REF has a rising edge, and the signal CK_REF goes high. The signal RESETB_CNT (not illustrated in FIG. 8A) also goes high such that the counter 510 starts to count periods of the signal CK_CPR, which for example results from a frequency division of the signal F_SENSOR.

At a time t2, the signal F_REF has a subsequent rising edge, and the signal CK_REF goes low. In the example of FIG. 8A, the counter 510 has not yet reached the count value of 65, and thus the signal UP_PCP is asserted to increase the NWELL voltage VNW. It can be seen that the PWELL voltage VPW also increases when the NWELL voltage VNW increases, due to the presence of a coupling capacitor between the PWELL and NWELL bulks. For example, in some embodiments the attenuation is around ⅓ between a voltage change in one bulk and the voltage change provoked in the other bulk.

At a time t3, the signal CK_CPR_DIV is asserted, causing the signal UP_PCP to go low.

At a time t4, the signal F_REF goes low, causing the signal EN_VMID (not illustrated in FIG. 8A) to go high, such that the voltage VMID is generated and settles at a voltage level L1. Shortly thereafter, at a time t5, the signal EN_NCP is asserted by the FSM 516, causing the actuator 414 to be activated. The signal VPW thus falls in order to reduce the PWELL voltage VPW and bring the voltage VMID closer to the target level equal for example to 0 V.

Figure 8B:
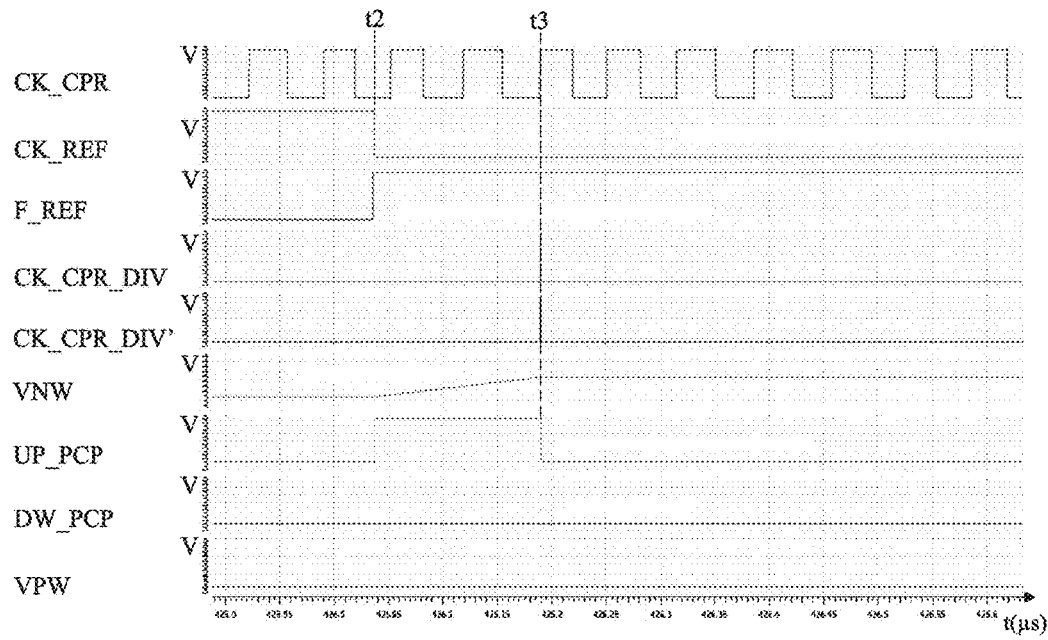

FIG. 8B illustrates the signals CK_CPR, CK_REF, F_REF and CK_CPR_DIV, a signal CK_CPR_DIV', and the signals VNW, UP_PCP, DW_PCP and VPW in more detail during the NWELL voltage control cycle at the times t2 and t3 of FIG. 8A. The signal CK_CPR_DIV' is for example generated by the counter 510 and for example corresponds to the signal CK_CPR_DIV delayed by 1.5 periods, and is thus used to determine whether or not the threshold TH2 of operation 705 of FIG. 7 has been exceeded. However, in the example of FIGS. 8A and 8B, the signal CK_REF has already gone low, and thus the signal CK_CPR_DIV is used only to time the end of the high pulse of UP_PCP, and the counter 510 is for example reset before CK_CPR_DIV' is asserted.

Figure 8C:
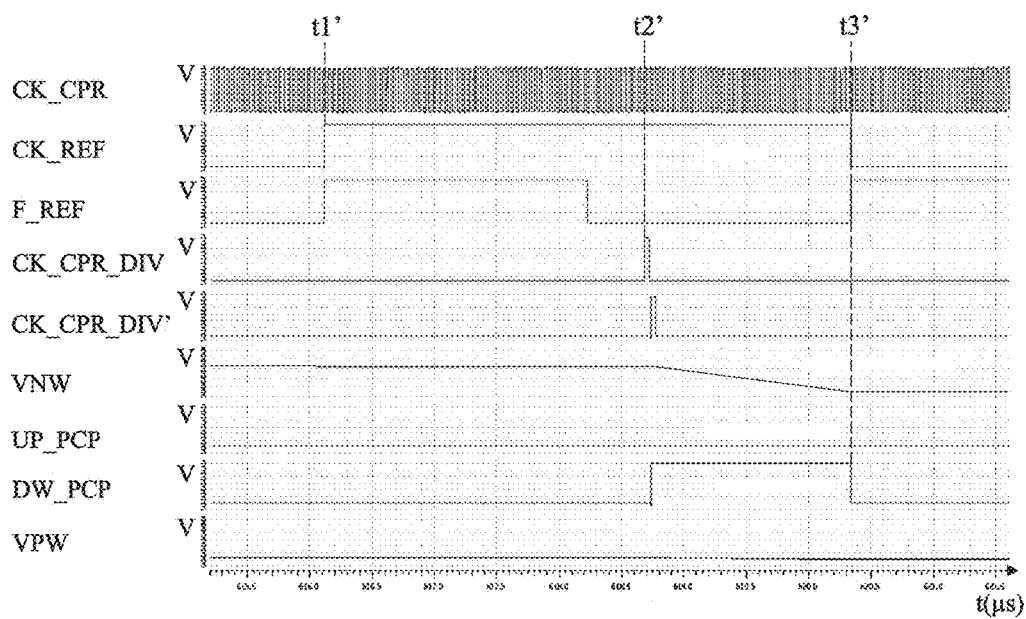

FIG. 8C illustrates examples of the signals CK_CPR, CK_REF, F_REF, CK_CPR_DIV, CK_CPR_DIV', VNW, UP_PCP, DW_PCP and VPW according to a case in which the signal DW_PCP is asserted to reduce the NWELL voltage VNW.

At a time t1', the signal F_REF has a rising edge, and the signal CK_REF goes high. The signal RESETB_CNT (not illustrated in FIG. 8A) also goes high such that the counter 510 starts to count periods of the signal CK_CPR, which for example results from a frequency division of the signal F_SENSOR.

At a time t2', the signal CK_CPR_DIV' is asserted before the end of the high pulse of the signal CK_REF, and thus the signal DW_PCP is asserted to decrease the NWELL voltage VNW.

At a time t3', the signal F_REF has a subsequent rising edge, and the signal CK_REF goes low, causing the signal DW_PCP to go low, halting the fall in the NWELL voltage VNW.

Figure 8D:
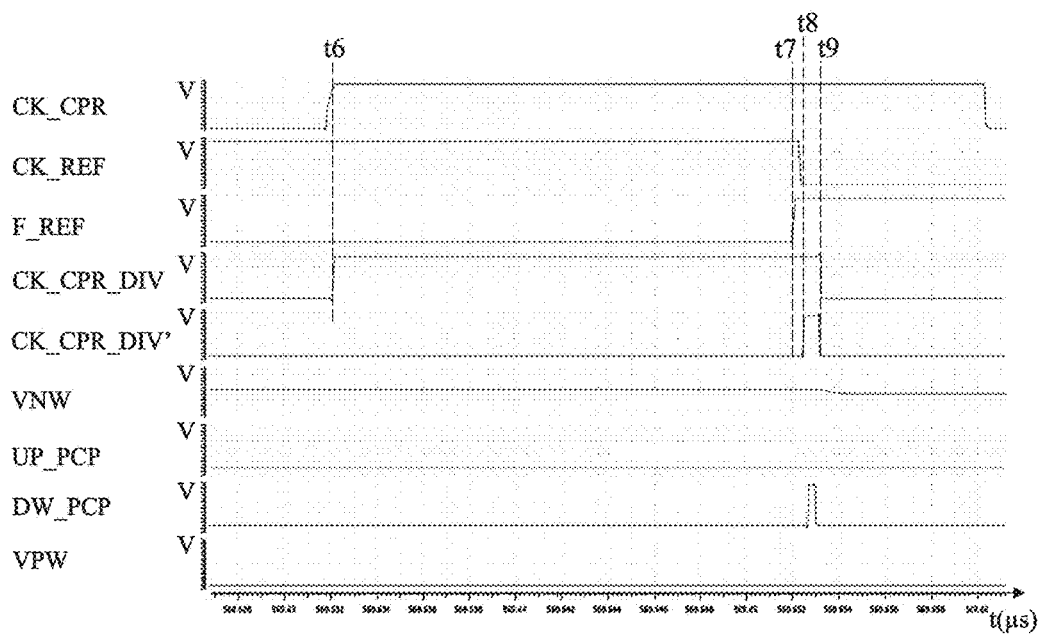

FIG. 8D illustrates examples of the signals CK_CPR, CK_REF, F_REF, CK_CPR_DIV, CK_CPR_DIV', VNW, UP_PCP, DW_PCP and VPW according to a case in which neither the signal UP_PCP nor the signal DW_PCP is asserted, and the NWELL voltage VNW is maintained at a relatively constant level.

At a time t6, the signal CK_CPR_DIV goes high, before the end of the high pulse of the signal CK_REF. At a time t7, the signal F_REF goes high, and the signal CK_REF goes low shortly thereafter. The signal CK_CPR_DIV' has a high pulse starting at a time t8, shortly after the falling edge of the signal CK_REF, and the signals CK_CPR_DIV and CK_CPR_DIV' both fall low shortly thereafter at a time t9. Given that the falling edge of the signal CK_REF is less than 1.5 clock periods of the signal CK_CPR after the rising edge of the signal CK_CPR_DIV and is before the high pulse of the signal CK_CPR_DIV', neither the signal UP_PCP nor the signal DW_PCP is asserted, and the NWELL voltage VNW remains constant.

Figure 8E:
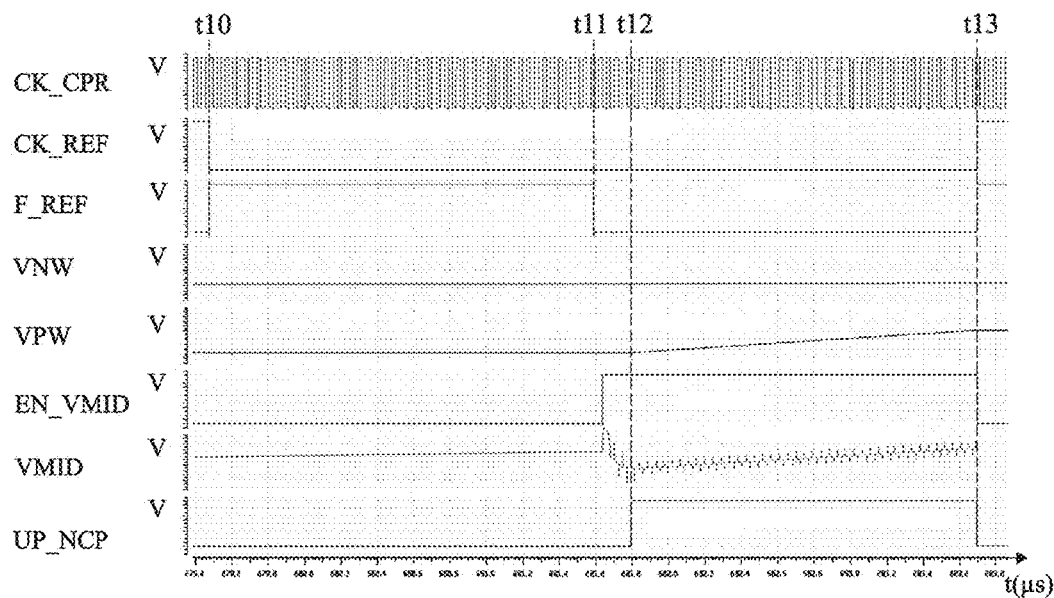

FIG. 8E illustrates examples of the signals CK_CPR, CK_REF, F_REF, VNW, VPW, EN_VMID, VMID and UP_NCP during control of the PWELL voltage VPW in the case that the signal UP_NCP is asserted.

At a time t10, the signal F_REF has a rising edge, and the signal CK_REF goes high. In this example, there is no modification of the NWELL voltage VNW during the high pulse of the signal F_REF.

At a time t11, the signal F_REF goes low, and shortly thereafter the signal EN_VMID is asserted. The voltage VMID then settles based on the voltages VNW and VPW.

At a time t12, the voltage VMID is found to be lower than the threshold VTH2 of FIG. 7 equal to 20 mV below the target level, and thus the signal UP_NCP is asserted.

At a time t13, the signals F_REF and CK_REF go high, causing the signals EN_VMID and UP_NCP to go low. Thus the voltage VPW progressively rises between the times t12 and t13.

Figure 8F:
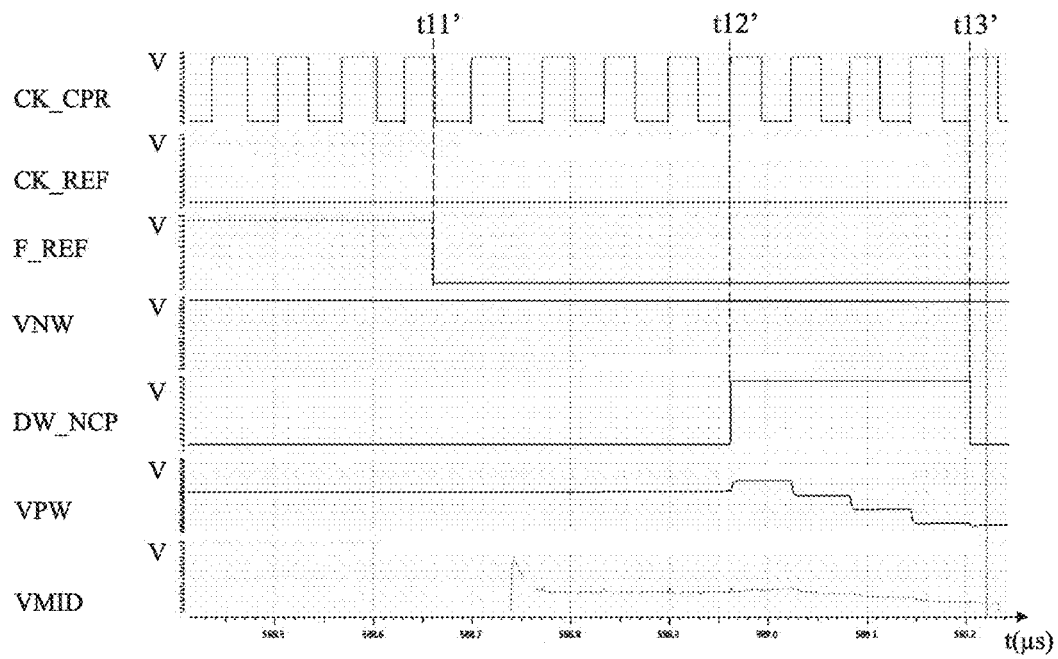

FIG. 8F illustrates examples of the signals CK_CPR, CK_REF, F_REF, VNW, DW_NCP, VPW and VMID during control of the PWELL voltage VPW in the case that the signal DW_NCP is asserted.

At a time t11', the signal F_REF goes low, and shortly thereafter the signal EN_VMID (not illustrated in FIG. 8F) is asserted, causing the voltage VMID to settle to a level based on the voltages VNW and VPW.

At a time t12', the voltage VMID is found to be more than 20 mV above the target level, and thus the signal DW_NCP is asserted.

At a time t13', the signal VMID is for example found to be less than 10 mV above the target level, and thus the signal DW_NCP is brought low. The voltage VPW is thus progressively reduced on each clock period of the clock CK_CPR between the times t12' and t13'.

Figure 8G:

FIG. 8G illustrates examples of the signals CK_CPR, CK_REF, F_REF, VNW, UP_NCP. VPW and VMID during control of the PWELL voltage VPW in the case that neither the signal DW_NCP nor the signal UP_NCP is asserted.

At a time t11", the signal F_REF goes low, and shortly thereafter the signal EN_VMID (not illustrated in FIG. 8G) is asserted, causing the voltage VMID to settle to a level based on the voltages VNW and VPW. In this example, it is assumed that VMID settles to a level within 20 mV of the target level, and thus there is no modification of the PWELL voltage VPW.

Figure 8H:
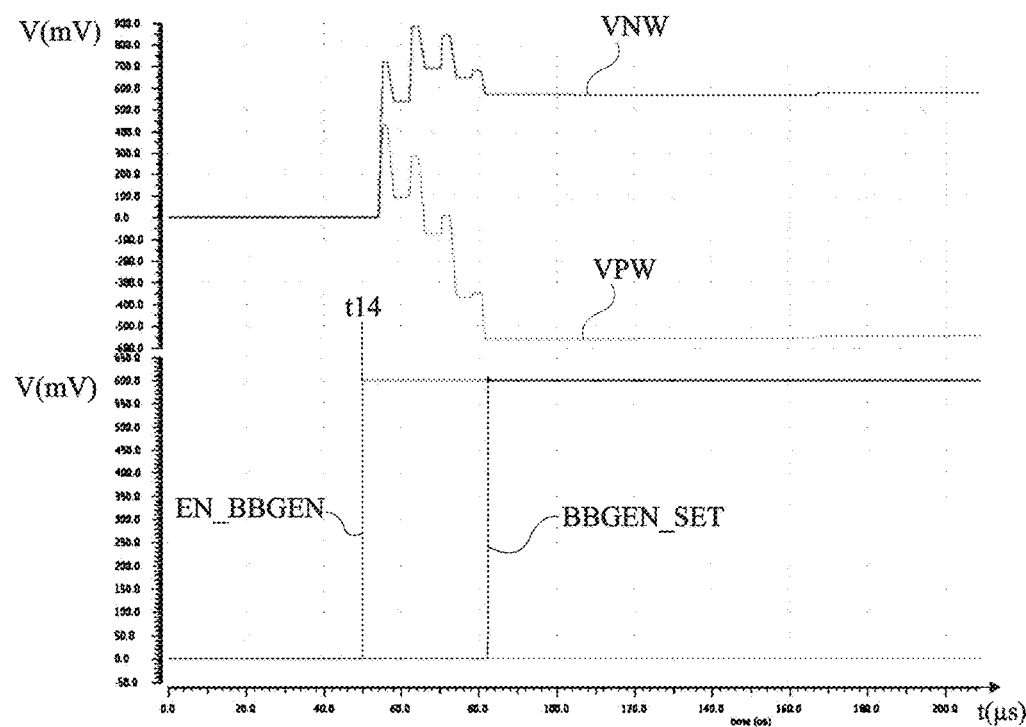

FIG. 8H illustrates examples of the NWELL and PWELL voltages VNW and VPW and of the signals EN_BBGEN and BBGEN_SET during a start-up phase of the body biasing voltage generator 304 of FIG. 5. The signal BBGEN_SET for example indicates when the sensor frequency, and in particular the count value COUNT, is close to the desired level. For example, in the case that the threshold TH1 of FIG. 7 is equal to 65, the signal BBGEN_SET indicates when the count value is at 63.

At a time t14, the signal EN_BBGEN goes high, causing shortly thereafter the voltages VNW and VPW to be adjusted based on the sensor signal F_SENSOR and the detected voltage level VMID. In this example, the values of VNW and VPW are symmetrical around the target intermediate level of VMID, which is for example at 0 V. The signal BBGEN_SET is for example asserted at a time t15 once the signals VNW and VPW have stabilized.

Figure 9:
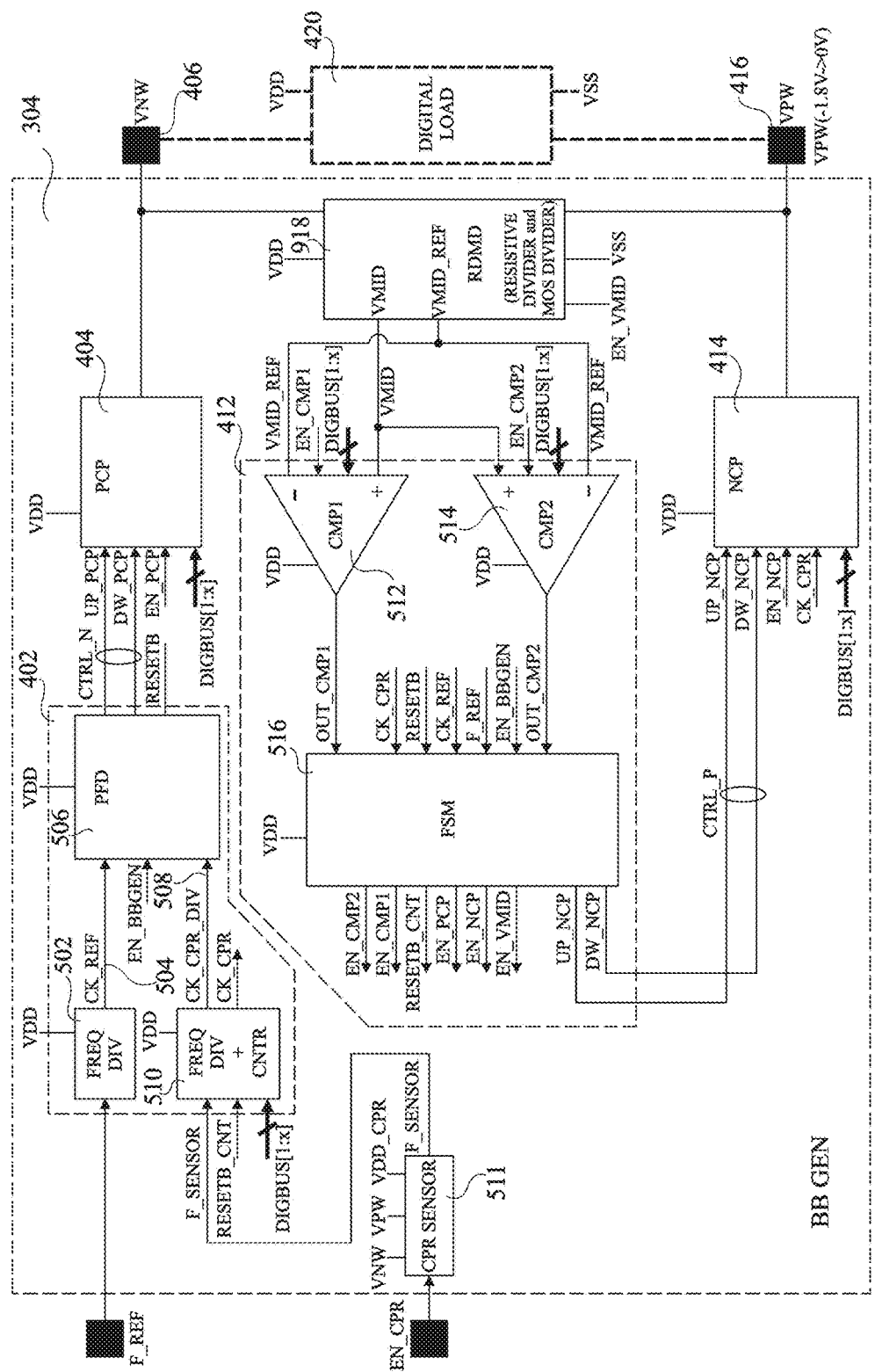
FIG. 9 schematically illustrates the body biasing voltage generator of FIG. 4 in more detail according to an example embodiment in which n-wells and p-wells are 5 biased in an asymmetrical fashion.

FIG. 9 schematically illustrates the body biasing voltage generator 304 of FIG. 4 in more detail according to an example embodiment in which the body biasing voltages VNW and VPW are generated in an asymmetrical fashion. Like in the example of FIG. 5, the reference signal F_REF and the sensor signal F_SENSOR are frequency signals. Many of the components of FIG. 9 are the same as those of FIG. 5, and have been labelled with like reference numerals and will not be described again in detail. However, the sensor 418 of FIG. 5 is replaced in FIG. 9 by a sensor 918 that generates both the voltage level VMID, and a reference value VMID_REF. Thus, whereas in the embodiment of FIG. 5 the target value of the intermediate voltage VMID was at a fixed value, for example at 0 V, in the embodiment of FIG. 9, the target level is variable based on the behaviour of the PMOS and NMOS devices in the circuit.

The reference voltage VMID_REF is for example supplied to the comparators 512 and 514. The comparator 512 for example compares the voltage VMID with a threshold equal to VMID_REF+20 mV, and the comparator 514 for example compares the voltage VMID with a threshold equal to VMID_REF-20 mV.

Figure 10:
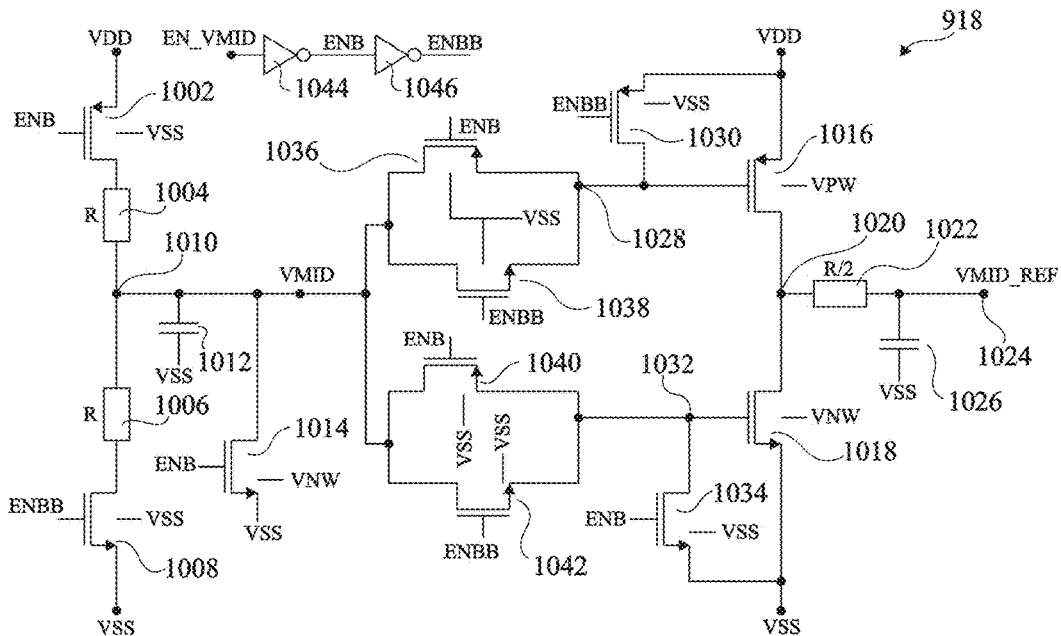
FIG. 10 schematically illustrates a resistive divider of FIG. 9 in more detail according to an example embodiment.

FIG. 10 illustrates the sensor 918 in more detail according to an example embodiment. The sensor 918 in this example is an ON resistance sensor that equilibrates the ON resistances of a PMOS and NMOS transistor. The sensor 918 for example comprises a PMOS transistor 1002, resistor 1004, further resistor 1006 and transistor 1008 coupled in series between the VDD supply rail and the VSS supply rail. The resistors 1004 and 1006 for example have an equal resistance R, equal for example to between 50 kohms and 1 Mohms. An intermediate node 1010 between the resistors 1004 and 1006 for example provides the voltage signal VMID. A capacitor 1012 for example has one of its terminals coupled to the node 1010, and its other terminal coupled to the supply rail VSS. Furthermore, the node 1010 is for example coupled to the supply rail VSS by the main conducting nodes of a further NMOS transistor 1014. The transistor 1002 is for example controlled by a signal ENB and the transistor 1008 by the inverse signal ENBB of the signal ENB.

The sensor 918 also for example comprises a PMOS transistor 1016 and NMOS transistor 1018 coupled in series between the supply voltage rails VDD and VSS. The transistor 1016 for example has its body node coupled to the PWELL voltage VPW, and the transistor 1018 for example has its body node coupled to the NWELL voltage VNW. An intermediate node 1020 between the transistors 1016 and 1018 is for example coupled, via a resistor 1022, to an output node 1024 providing the voltage VMID_REF. The resistor 1022 for example have a resistance of approximately half the resistance R of the resistors 1004 and 1008. The node 1024 is for example coupled to one terminal of a capacitor 1026, the other terminal of which is coupled to the supply rail VSS.

The transistor 1016 for example has its gate coupled to a node 1028, which is in turn coupled to the supply rail VDD via the main conducting nodes of a PMOS transistor 1030 controlled by the signal ENBB. Similarly, the transistor 1018 for example has its gate coupled to a node 1032, which is in turn coupled to the supply rail VSS via the main conducting nodes of an NMOS transistor 1034 controlled by the signal ENB. The node 1028 is coupled to the voltage VMID at the node 1010 via the parallel connection of a PMOS transistor 1036 and an NMOS transistor 1038. Similarly, the node 1032 is coupled to the voltage VMID at the node 1010 via the parallel connection of a PMOS transistor 1040 and an NMOS transistor 1042. The PMOS transistors 1036 and 1040 are controlled by the signal ENB, and the NMOS transistors 1038 and 1042 are controlled by the signal ENBB. The signal ENB is for example generated by inversing, by an inverter 1044, the signal EN_VMID, and the signal ENBB is for example generated by inversing, by an inverter 1046, the signal ENBB.

In operation, the transistors 1016 and 1018 permit the voltage signal VMID_REF to be generated in order to equilibrate the ON resistances of the transistors 1016 and 1018, while taking into account any variation in behaviour between the NMOS and PMOS transistors.

Figure 11:
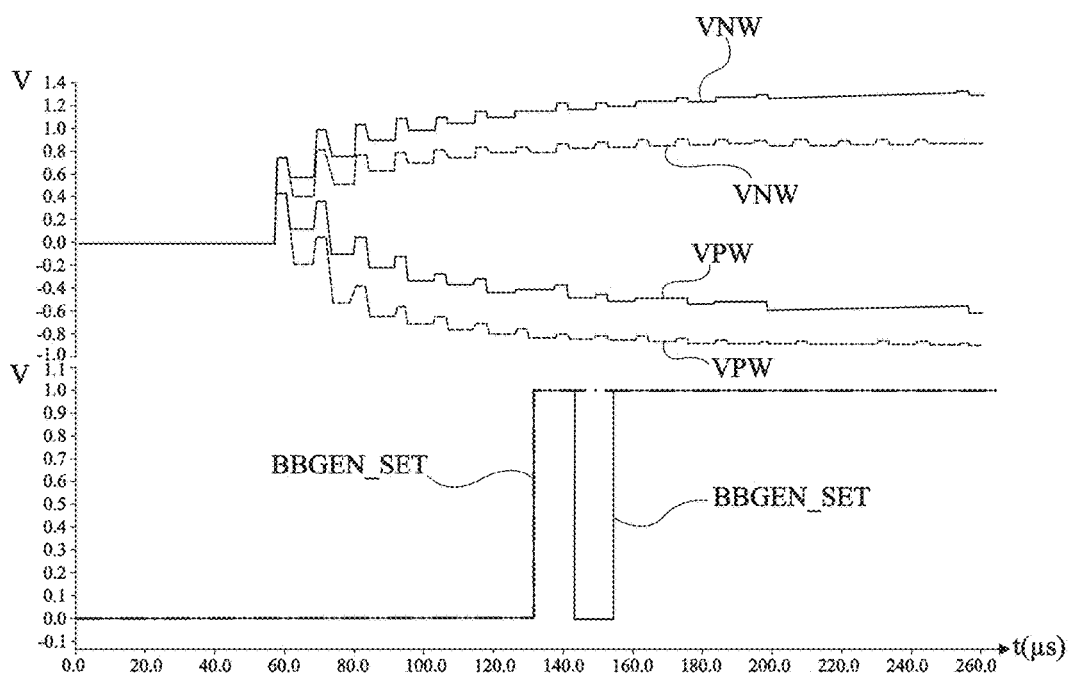
FIG. 11 is a timing diagram representing a start-up phase of the circuits of FIGS. 9 and 10 with respect to the circuits of FIGS. 5 and 6 according to an example embodiment.

FIG. 11 illustrates, with dashed curves, examples of the NWELL and PWELL voltages VNW, VPW during the start-up phase of the circuit of FIG. 5, and with solid curves, examples of the NWELL and PWELL voltages VNW, VPW during the start-up phase of the circuit of FIG. 9.

The dashed curves in FIG. 11 are similar to the example of FIG. 8H, and will not be described again in detail. The solid curves illustrate an example in which it is found that the voltage VMID_REF is higher than VDD/2, and thus the NWELL voltage VNW is boosted with respect to the PWELL voltage VPW, and then stabilizes within the range (VDD/2)−10 mV<VMID_REF<(VDD/2)+10 mV.

A dashed-dotted curve in FIG. 11 illustrates the signal BBGEN_SET in the case of the circuit of FIG. 5, whereas solid curves represent the signal BBGE_SET in the case of the circuit of FIG. 9, which in this example rises and falls before the final stabilization.

An advantage of the embodiments described herein is that, by providing two control loops for generating the NWELL and PWELL voltages, one control loop controlling one of the voltages based on the overall desired performance, and the other control loop controlling the relative levels of the NWELL and PWELL voltages, a stable control mechanism is achieved that can be implemented in a relatively simple fashion.

Having thus described at least one illustrative embodiment, various alterations, modifications and improvements will readily occur to those skilled in the art. For example, it will be apparent to those skilled in the art that while embodiments have been described in the case of SOI MOS transistors, the techniques and principles described herein could be applied to other transistor technologies.

Furthermore, it will be apparent to those skilled in the art that the particular voltage levels of the various VDD, ground and VSS supply voltage levels will depend on the particular application and on the particular transistor technology.

Further still, while embodiments have been described in which the generation of the NWELL and PWELL voltages VNW, VPW is based on transistor speed, in alternatively embodiments, the controllers are adapted to generate the NWELL and PWELL voltages VNW, VPW based on a target leakage, the NWELL controller 402 generating the NWELL voltage based on an overall target leakage, and the PWELL controller 412 generating the PWELL voltage in order that the voltage VNW and VPW are symmetrical around a target mid-point, or asymmetrical in view of a detected bias between the current leakage of PMOS and NMOS devices in the circuit. In such a case, the sensor 418 is for example replaced by a leakage sensor configured to sense a difference in current leakage between the two transistor types (for example NMOS and PMOS).

Furthermore, while embodiments have been described in which an NWELL voltage is generated by a positive charge pump and a PWELL voltage is generated by a negative charge pump, in alternative embodiments a positive or negative charge pump could be used to generate both of the well voltages, for example in the case that the wells are of the same type.

The invention claimed is:

1. A transistor biasing circuit comprising:
    a first control loop comprising:
        a first controller configured to receive a sensor signal generated based on the performance of one or more transistors of a digital circuit, the first controller being configured to compare the sensor signal with a reference signal and to generate a first biasing voltage control signal based on said comparison; and
        a first actuator configured to generate a first biasing voltage for biasing wells of transistors of a first type in said digital circuit based on said first biasing voltage control signal; and
    a second control loop comprising:
        a second actuator configured to generate a second biasing voltage for biasing wells of transistors of a second type in said digital circuit based on a second biasing voltage control signal; and
        a second controller configured to generate the second biasing voltage control signal based on an intermediate voltage level generated based on the first and second biasing voltages, wherein the first control loop controls the first biasing voltage and not the second biasing voltage, and the second control loop controls the second biasing voltage and not the first biasing voltage.

2. The transistor biasing circuit of claim 1, wherein the sensor signal is a frequency signal generated by a plurality of transistors of the digital core biased by said first and second biasing voltages, the frequency of the frequency signal being dependent on the speed of said transistors.

3. The transistor biasing circuit of claim 1, further comprising a further sensor configured to generate said intermediate voltage level.

4. The transistor biasing circuit of claim 3, wherein said further sensor comprises a resistive divider or an ON resistance sensor.

5. The transistor biasing circuit of claim 3, wherein second controller further comprises a first comparator configured to compare said intermediate voltage level with a first voltage threshold and a second comparator configured to compare said intermediate voltage level with a second voltage threshold.

6. The transistor biasing circuit of claim 5, wherein the first and second voltage thresholds are fixed thresholds.

7. The transistor biasing circuit of claim 5, wherein said first and second voltage thresholds are variable thresholds based on a variable reference signal generated by said further sensor.

8. The transistor biasing circuit of claim 1, further comprising a further sensor configured to generate the intermediate voltage level and wherein the sensor signal represents a current leakage of a plurality of transistors of the digital core biased by said first and second biasing voltages, and wherein said further sensor comprises a current leakage sensor.

9. The transistor biasing circuit of claim 1, wherein the first and second actuators are charge pumps.

10. An integrated circuit comprising:
    a digital circuit; and
    a transistor biasing circuit comprising:
    a first control loop comprising:
        a first controller configured to receive a sensor signal generated based on the performance of one or more transistors of a digital circuit, the first controller being configured to compare the sensor signal with a reference signal and to generate a first biasing voltage control signal based on said comparison; and
        a first actuator configured to generate a first biasing voltage for biasing wells of transistors of a first type in said digital circuit based on said first biasing voltage control signal; and
    a second control loop comprising:
        a second actuator configured to generate a second biasing voltage for biasing wells of transistors of a second type in said digital circuit based on a second biasing voltage control signal; and a second controller configured to generate the second biasing voltage control signal based on an intermediate voltage level generated based on the first and second biasing voltages, wherein the first control loop controls the first biasing voltage and not the second biasing voltage, and the second control loop controls the second biasing voltage and not the first biasing voltage.

11. The integrated circuit of claim 10, wherein said one or more transistors of said digital circuit are SOI (silicon on insulator) transistors.

12. A method of generating transistor biasing voltages comprising:

receiving, by a first controller of a first control loop, a sensor signal generated based on the performance of one or more transistors of a digital circuit;

comparing, by the first controller, the sensor signal with a reference signal and generating a first biasing voltage control signal based on said comparison;

generating, by a first actuator of the first control loop based on said first biasing voltage control signal, a first biasing voltage for biasing wells of transistors of a first type in said digital circuit;

generating, by a second actuator of a second control loop based on a second biasing voltage control signal, a second biasing voltage for biasing wells of transistors of a second type in said digital circuit; and generating, by a second controller of the second control loop, the second biasing voltage control signal based on an intermediate voltage level generated based on the first and second biasing voltages, wherein the first control loop controls the first biasing voltage and not the second biasing voltage, and the second control loop controls the second biasing voltage and not the first biasing voltage.

* * * * *